United States Patent
Yamamoto

[11] Patent Number: 6,064,142
[45] Date of Patent: May 16, 2000

[54] PIEZOELECTRIC RESONATOR AND ELECTRONIC COMPONENT CONTAINING SAME

[75] Inventor: Takashi Yamamoto, Ishikawa-ken, Japan

[73] Assignee: Murata Manufacturing Co., Ltd., Kyoto, Japan

[21] Appl. No.: 08/846,298

[22] Filed: Apr. 30, 1997

[30] Foreign Application Priority Data

Oct. 23, 1996 [JP] Japan ................................. 8-299786

[51] Int. Cl.⁷ .................................................. H01L 41/08
[52] U.S. Cl. ........................ 310/348; 310/344; 310/366
[58] Field of Search ................................. 310/328, 366, 310/321, 348; 333/187–189

[56] References Cited

U.S. PATENT DOCUMENTS

| | | | |
|---|---|---|---|
| 2,157,665 | 5/1939 | Hollmann | 310/315 |
| 2,998,535 | 8/1961 | Church et al. | 310/325 |
| 3,185,869 | 5/1965 | Shoor | 310/315 |
| 3,297,889 | 1/1967 | Breskend | 310/315 |
| 3,390,287 | 6/1968 | Sonderegger | 310/328 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,193,009 | 3/1980 | Durley, III | 310/323 |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/366 |
| 4,564,782 | 1/1986 | Ogawa | 333/191 X |
| 4,570,098 | 2/1986 | Tomita et al. | 310/346 |
| 4,608,509 | 8/1986 | Yamamoto et al. | 310/344 X |
| 4,633,120 | 12/1986 | Sato et al. | 310/366 X |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inuoe et al. | 310/366 |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inuoe et al. | 310/366 X |
| 5,446,485 | 8/1995 | Usui | 347/72 |
| 5,517,073 | 5/1996 | Ohkuma | 310/315 |

(List continued on next page.)

FOREIGN PATENT DOCUMENTS

| | | | |
|---|---|---|---|
| 5-160459 | 5/1993 | Japan | 310/366 |

Primary Examiner—Mark O. Budd
Attorney, Agent, or Firm—Graham & James LLP

[57] ABSTRACT

A piezoelectric resonator is capable of being mounted without any directional restriction. The piezoelectric resonator includes a laminated body having two groups of internal electrodes which are alternately laminated with piezoelectric layers interposed therebetween. Strips of first insulating film are disposed on two of the four side surfaces of the laminated body, which two side surfaces are perpendicular to each other. Strips of second insulating film are disposed on the other two side surfaces of the laminated body arranged perpendicular to each other. A first external electrode is disposed on one of the two side surfaces on which the first insulating film is disposed, and a second external electrode is disposed on the other of the two side surfaces. The first and second external electrodes are connected to the second group of internal electrodes. On the other hand, another first external electrode is provided on one of the two side surfaces on which the second insulating film is formed, and another second external electrode is disposed on the other of these two side surfaces. These first and second external electrodes are connected to the first group of internal electrodes.

20 Claims, 10 Drawing Sheets

U.S. PATENT DOCUMENTS

| | | | |
|---|---|---|---|
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

FIG. 6
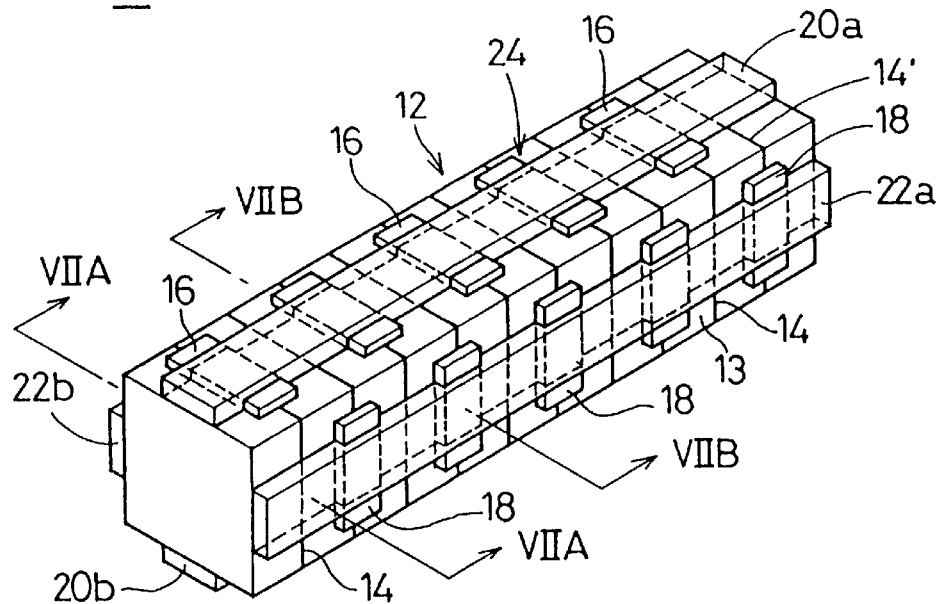
FIG. 7A
FIG. 7B
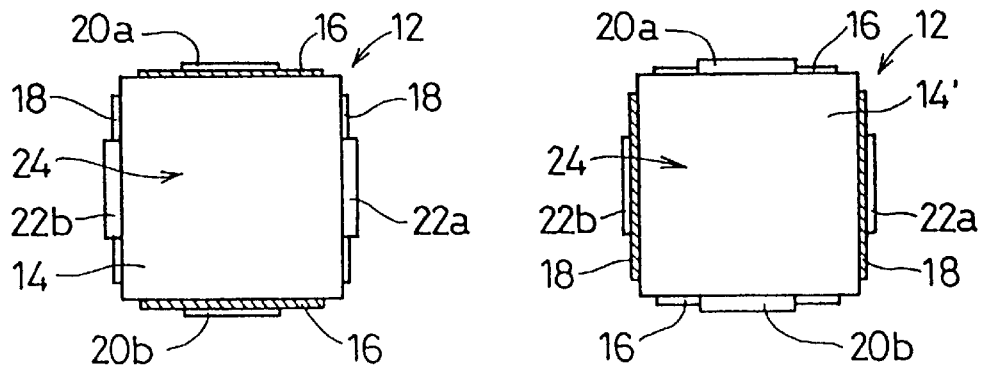
FIG. 8
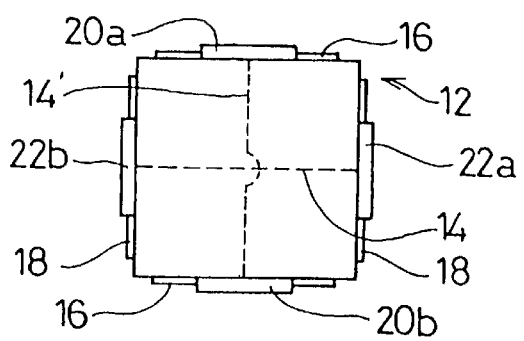

PIEZOELECTRIC RESONATOR AND ELECTRONIC COMPONENT CONTAINING SAME

BACKGROUND OF THE INVENTION

1. Field of the Invention

The present invention relates to a novel piezoelectric resonator and to an electronic component containing the novel piezoelectric resonator. More particularly, the present invention relates to a piezoelectric resonator which maximizes the efficient use of mechanical vibration of a piezoelectric member and also relates to an electronic component such as a ladder type filter, an oscillator or a discriminator containing the novel piezoelectric resonator.

2. Description of the Related Art

FIG. 19 is a perspective view of a laminated piezoelectric resonator 1 which the applicant of the present invention proposed in Japanese Patent Application No. 8-110475 which has not been published or laid open. FIG. 20 is a diagram showing the disposition of external electrodes on the piezoelectric resonator. The laminated piezoelectric resonator 1 preferably includes a laminated body 2 which preferably has a substantially rectangular block shape and which is formed by laminating a plurality of piezoelectric layers 3 and internal electrodes 4 interposed between the piezoelectric layers 3 so as to form an integral unit. Each piezoelectric layer 3 is preferably formed of a piezoelectric ceramic. The internal electrodes 4 are positioned a predetermined distance apart from each other and have major surfaces arranged to be substantially perpendicular to the longitudinal direction of the laminated body 2.

The piezoelectric layers 3 are polarized along a longitudinal direction of the laminated body 2 so that the adjacent pair of the piezoelectric layers 3 on the opposite sides of each internal electrode 4 are polarized in opposite directions, as indicated by the arrows in FIG. 19, thereby forming a vibrating section 5 or active section.

Strips of insulating film 6 and strips of insulating film 7 are respectively disposed on two opposite side surfaces of the laminated body 2. Edges of the internal electrodes 4 exposed at a first of the opposite side surfaces of the laminated body 2 are alternately covered and left uncovered with insulating film 6. Edges of the internal electrodes 4 exposed at a second of the side surfaces of the laminated body 2, those opposite from the exposed edges not covered with insulating film 6 in the first side surface are covered with insulating film 7.

Further, on the side surfaces of the laminated body 2 on which insulating films 6 and 7 are disposed, external electrodes 8 and 9 for functioning as input/output electrodes are also disposed. The external electrode 8 is connected to the internal electrodes 4 not covered with insulating film 6 while the external electrode 9 is connected to the internal electrodes 4 not covered with insulating film 7. That is, each adjacent pair of the internal electrodes 4 are respectively connected to the external electrodes 8 and 9.

When an alternating current signal having a voltage, the direction of which changes with time, is applied to the laminated piezoelectric resonator 1, the laminated body 2 vibrates in the longitudinal direction. That is, when an electric field is applied to each piezoelectric layer 3 in the same direction as the polarization, each piezoelectric layer 3 expands in the longitudinal direction of the laminated body 2 and the entire laminated body 2 expands along the longitudinal direction. When an electric field is applied to each piezoelectric layer 3 in the direction opposite to the direction of the polarization, each piezoelectric layer 3 contracts in the longitudinal direction of the laminated body 2 and the entire laminated body 2 also contracts along the longitudinal direction. These movements are alternately repeated.

In the piezoelectric resonator 1 constructed as described above, all the directions of expansion or contraction of the piezoelectric layers 3 caused when electric fields are applied thereto are the same. In the piezoelectric resonator 1, therefore, an input signal can be efficiently converted into mechanical vibration and the electromechanical coupling coefficient can be increased, so that ΔF which is the difference between the resonant frequency F and the antiresonant frequency Fa is comparatively large. Therefore, the piezoelectric resonator 1 having such characteristics is suitable for use as, for example, a wide band filter.

FIG. 21 shows an example of a ladder type filter constructed by combining a plurality of laminated piezoelectric resonators 1. The ladder type filter 100 shown in FIG. 21 includes a substrate 102 preferably formed of alumina. Thick film electrodes 104 are provided on a surface of the substrate 102. The thick film electrodes 104 are formed of patterns on the substrate 102 so as to establish connections such as those indicated by the broken lines in FIG. 21. The laminated piezoelectric resonators 1 each having the above-described structure are mounted on the substrate 102 preferably with an electroconductive paste 106 interposed therebetween. One external electrode 9 of one of the laminated piezoelectric resonators 1 is connected to one of the pattern electrodes 102 on the substrate 102 preferably by electroconductive paste 106 while the other external electrode 8 is electrically connected to the external electrode 8 of another of the laminated piezoelectric resonators 1 or to one of the thick film electrodes 104 on the substrate 102. A metallic cap 112 for protecting the laminated piezoelectric resonators 1 is bonded to the substrate 102 by an adhesive 110.

In the above-described laminated piezoelectric resonator 1, a pair of external electrodes 8 and 9 are disposed on opposite side surfaces or on a common side surface and are used for connection to an external circuit or a different kind of electronic circuit.

In the above-described laminated piezoelectric resonator 1, however, since the external electrode 8 is disposed, for example, on only one of four side surfaces of the cuboid laminated body 2 as shown in FIG. 20, connection to the external electrode 8 is impossible on the other three side surfaces. The same can also be said with respect to the external electrode 9. Thus, the above-described laminated piezoelectric resonator 1 has a directionality when mounted on a substrate or the like and there is a need for a process step of arranging laminated piezoelectric resonators 1 so that each piezoelectric resonator 1 faces in a predetermined direction in the process of manufacturing an electronic component.

Due to such a mounting directionality, considerable restrictions are imposed on the design and manufacture of a ladder type filter which is formed by combining a plurality of laminated piezoelectric resonators 1, so that it is difficult to reduce the size and manufacturing cost of the filter. For example, in the case of the ladder type filter 100 shown in FIG. 21, there is a directional restriction on mounting laminated piezoelectric resonators 1 such that the laminated piezoelectric resonators 1 must be arranged in a direction parallel to the surface of the substrate 102, thereby requiring that the mounting area of the substrate 102 be disadvantageously large. Moreover, there is also a problem with complicated wiring using wires 104 required for connecting external electrodes 8 or 9.

SUMMARY OF THE INVENTION

To overcome the problems described above, the preferred embodiments of the present invention provide a piezoelectric resonator which can be mounted without any directional restriction.

According to one preferred embodiment of the present invention, there is provided a piezoelectric resonator including a laminated body adapted to vibrate in a longitudinal vibration mode, the piezoelectric resonator comprising at least one first external electrode disposed on a first side surface of the laminated body, and a second external electrode connected to the first external electrode through a group of internal electrodes disposed in the laminated body, the second external electrode being disposed on a second side surface of the laminated body that is different from the first side surface on which the first external electrode is formed.

In a piezoelectric resonator of the preferred embodiments of the present invention, the first and second external electrodes disposed on different side surfaces are connected in common to a group of internal electrodes, thereby eliminating a directional restriction on mounting the piezoelectric resonator on a substrate or the like.

According to another preferred embodiment of the present invention, there is provided a piezoelectric resonator comprising a laminated body having a longitudinal direction, a vibrating section constituting at least a first part of the laminated body, the vibrating section including a plurality of piezoelectric layers polarized along the longitudinal direction of the laminated body and a plurality of internal electrodes arranged in the laminated body so that major surfaces of the electrodes substantially are perpendicular to the longitudinal direction of the laminated body, the piezoelectric layers and the internal electrodes being alternately laminated, the vibrating section being adapted to generate vibration in the longitudinal fundamental mode in the laminated body, at least one first external electrode disposed on a first side surface of the laminated body and connected to one of the opposing pair of the internal electrodes located on the opposite sides on each of the piezoelectric layers constituting the vibrating section, and a second external electrode disposed on a second side surface of the laminated body different from the first side surface on which the first external electrode is disposed, the second external electrode being connected to the first external electrode via the internal electrodes connected to the first external electrode.

Also in this piezoelectric resonator of the preferred embodiments of the present invention, the first and second external electrodes disposed on different side surfaces are connected in common to a group of internal electrodes, thereby eliminating a directional restriction on mounting the piezoelectric resonator on a substrate or the like.

According to still another preferred embodiment of the present invention, there is provided an electronic component using one of the above-described piezoelectric resonators as a first piezoelectric resonator and using a second piezoelectric resonator of a laminated type having a pair of external electrodes disposed on different side surfaces, wherein the first and second piezoelectric resonators are superposed one on another, and the second external electrode of the first piezoelectric resonator and one of the external electrodes of the second piezoelectric resonator are connected to each other via an electroconductive material.

This electronic component of the preferred embodiments of the present invention are preferably formed by superposing the above-described piezoelectric resonator and the laminated type piezoelectric resonator on one another on a substrate, so that an area of the substrate can be reduced and the packaging density can be increased.

According to a further preferred embodiment of the present invention, there is provided an electronic component using a plurality of piezoelectric resonators each having structure and arrangement as one of the above-described piezoelectric resonators, wherein the plurality of piezoelectric resonators are mounted on a substrate and are superposed on one another, the first external electrode of one of the piezoelectric resonators is connected to a pattern electrode disposed on the substrate, and the second external electrode of this piezoelectric resonator and one of the external electrodes of the other piezoelectric resonator which is superposed are connected to each other by an electroconductive material.

This electronic component of the preferred embodiments of the present invention is preferably formed by superposing a plurality of the piezoelectric resonators on one another on a substrate, so that the area of the substrate can be reduced and the packaging density can be increased.

In the piezoelectric resonator of the preferred embodiments of the present invention, because the first and second external electrodes disposed on different side surfaces of the laminated body are connected in common to a group of internal electrodes, external pattern electrodes or the like can be connected to the same internal electrodes through different side surfaces, so that directional restrictions at the time of mounting are eliminated in comparison with the conventional arrangement. Thus, the degree of freedom in designing an electronic component can be increased by using the piezoelectric resonator of the preferred embodiments of the present invention. Also, the packaging density in an electronic component can be improved if the piezoelectric resonator of the preferred embodiments of the present invention is used. Therefore, an electronic component, e.g., an oscillator, a discriminator or a filter can be designed so as to have a substantially reduced size according to the preferred embodiments of the present invention. Further, such an electronic component can be manufactured at a lower cost because a process step of arranging piezoelectric resonators so that each piezoelectric resonator faces in a predetermined direction at the time of manufacturing can be removed, and because the connections between the elements can be simplified.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

FIG. 6 is a perspective view of another example of the piezoelectric resonator of the preferred embodiments of the present invention;

FIG. 7A is a cross-sectional view taken along the line VIIA—VIIA of FIG. 6;

FIG. 7B is a cross-sectional view taken along the line VIIB—VIIB of FIG. 1;

FIG. 8 is a diagram of connections between external electrodes in the laminated body of the piezoelectric resonator shown in FIG. 6;

DETAILED DESCRIPTION OF PREFERRED EMBODIMENTS

Figure 1:
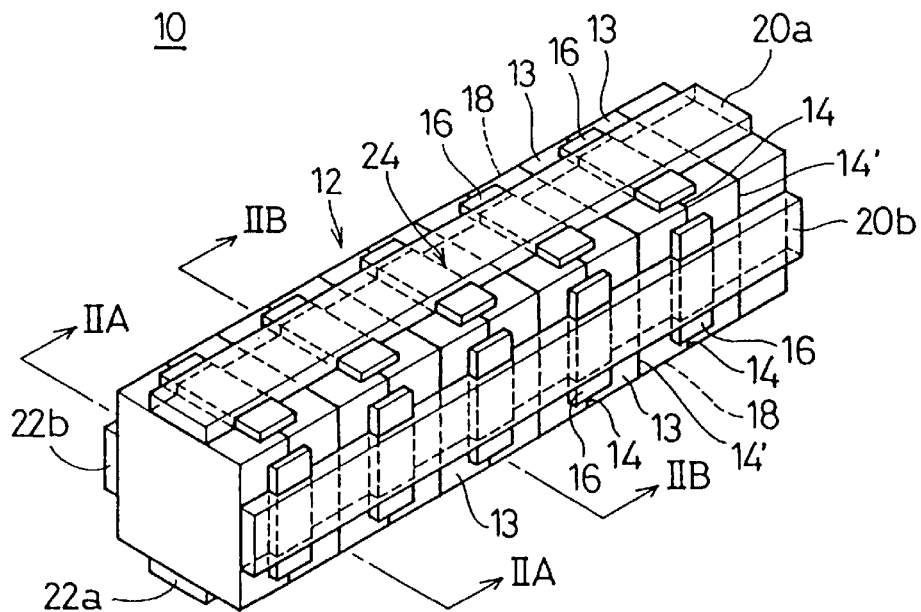
FIG. 1 is a perspective view of an example of a piezoelectric resonator of the preferred embodiments of the present invention.
Figure 2A:
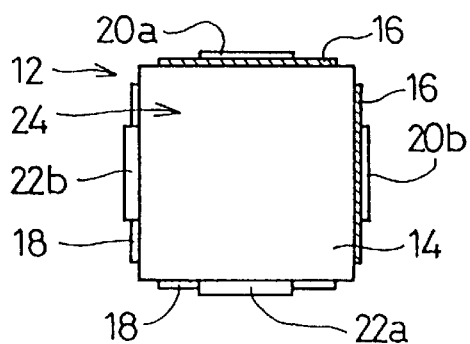
FIG. 2A is a cross-sectional view taken along the line IIA—IIA of FIG. 1.
Figure 2B:
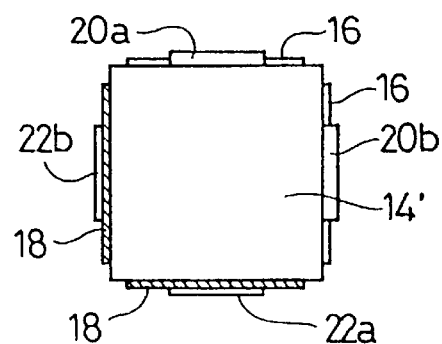
FIG. 2B is a cross-sectional view taken along the line IIB—IIB of FIG. 1.

FIG. 1 shows a piezoelectric resonator 10 which represents a preferred embodiment of the present invention.

As shown in FIG. 1, the piezoelectric resonator 10 includes a laminated body 12 which has, for example, the shape of a substantially rectangular block. The laminated body 12 has a vibrating section 24 which is formed by laminating a plurality of piezoelectric layers 13 and a plurality of internal electrodes 14, 14' interposed between the piezoelectric layers 13 so as to form an integral unit. Each piezoelectric layer 13 is preferably formed of a piezoelectric ceramic. The internal electrodes 14, 14' are arranged at a predetermined distance apart from each other and have major surfaces arranged substantially perpendicular to the longitudinal direction of the laminated body 12. In this specification, for ease of explanation, one of each adjacent pair of internal electrodes, between which, one of the piezoelectric layers 13 forming the laminated body 12 is interposed, is referred to as internal electrode 14, while the other of the adjacent pair of internal electrodes is referred to as internal electrode 14'. That is, the internal electrodes 14 and the internal electrodes 14' are alternately arranged along the longitudinal direction of the laminated body 12.

Figure 19:
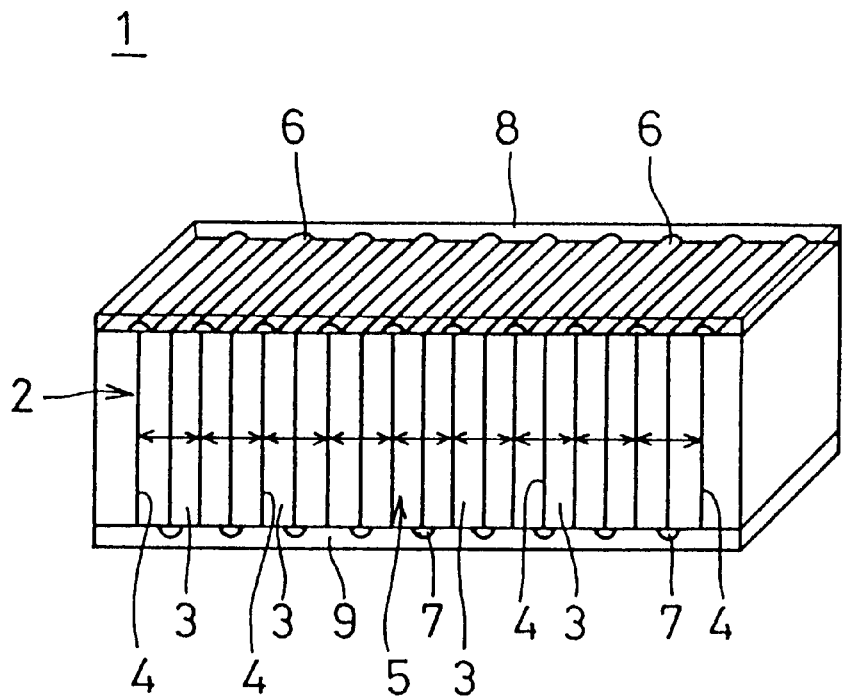
FIG. 19 is a perspective view of a laminated piezoelectric resonator which the applicant of the present invention described in Japanese Patent Application No. 8-110475 which has not been published or laid open.

The vibrating section 24 is provided for generating vibration of the laminated body 12 in the longitudinal fundamental mode. In the vibrating section 24, each adjacent pair of piezoelectric layers 13 between which one internal electrode 14 or 14' is interposed are polarized in opposite directions along the longitudinal direction of the laminated body 12, as shown by the arrows shown in FIG. 19.

Strips of insulating film 16 are preferably provided on each of two of the four side surfaces of the laminated body 12, which two sides are arranged perpendicular to each other. These strips of insulating film 16 cover exposed edges of the internal electrodes 14.

On each of the other two side surfaces of the laminated body 12, which two other sides are perpendicular to each other, strips of insulating film 18 are provided. These strips of insulating film 18 cover exposed edges of the internal electrodes 14' not covered by insulating film 16 on the two side surfaces described in the previous paragraph.

That is, insulating film 16 and insulating film 18 are disposed on different side surfaces of the laminated body 12 and are disposed alternately with each other along the longitudinal direction of the laminated body 12.

On one of the two side surfaces on which the insulating film 16 is provided, a first external electrode 20a is disposed to extend from one end to the other end of the laminated body 12 in the longitudinal direction. On the other of the two side surfaces on which insulating film 16 is provided, a second external electrode 20b is disposed to extend from one end to the other end of the laminated body 12 in the longitudinal direction. The first and second external electrodes 20a and 20b are connected to the internal electrodes 14' which are not covered by insulating film 16.

On the other hand, on one of the two side surfaces on which insulating film 18 is provided, another first external electrode 22a is disposed to extend from one end to the other end of the laminated body 12 in the longitudinal direction. On the other of the two side surfaces on which insulating film 18 is disposed, another second external electrode 22b is disposed to extend from one end to the other end of the laminated body 12 in the longitudinal direction. These first and second external electrodes 22a and 22b are connected to the internal electrodes 14 which are not covered with insulating film 18.

Figure 3:
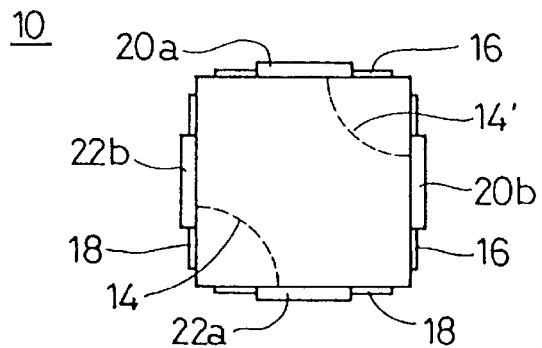
FIG. 3 is a diagram of connections between external electrodes in the laminated body of the piezoelectric resonator shown in FIG. 1.

The connections of the first external electrodes 20a and 22a and the second external electrodes 20b and 22b thereby achieved in the laminated body 12 are shown in FIG. 3. That is, the first and second external electrodes 20a and 20b are connected to each other through the internal electrodes 14' in the laminated body 12 while the other first and second external electrodes 22a and 22b are connected to each other through the other internal electrodes 14 in the laminated body 12.

Therefore, an alternating current signal for applying an electric field to the piezoelectric layer 13 interposed between each opposing pair of internal electrodes 14 and 14' can be applied via the first external electrodes 20a and 22a and/or the second external electrodes 20b and 22b used as input/output electrodes, thereby making the vibrating section 24 of the laminated body 12 piezoelectrically active. Vibration is thereby generated in the longitudinal vibration mode with a node being defined a central portion of the laminated body 12.

Figure 4:
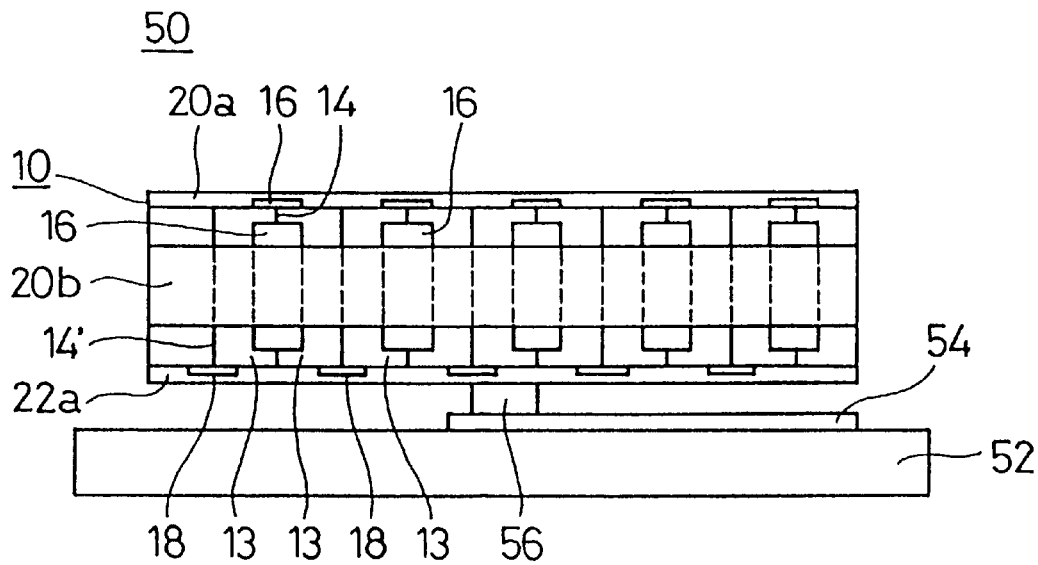
FIG. 4 is a front view of an electronic component using the piezoelectric resonator shown in FIG. 1.
Figure 5:
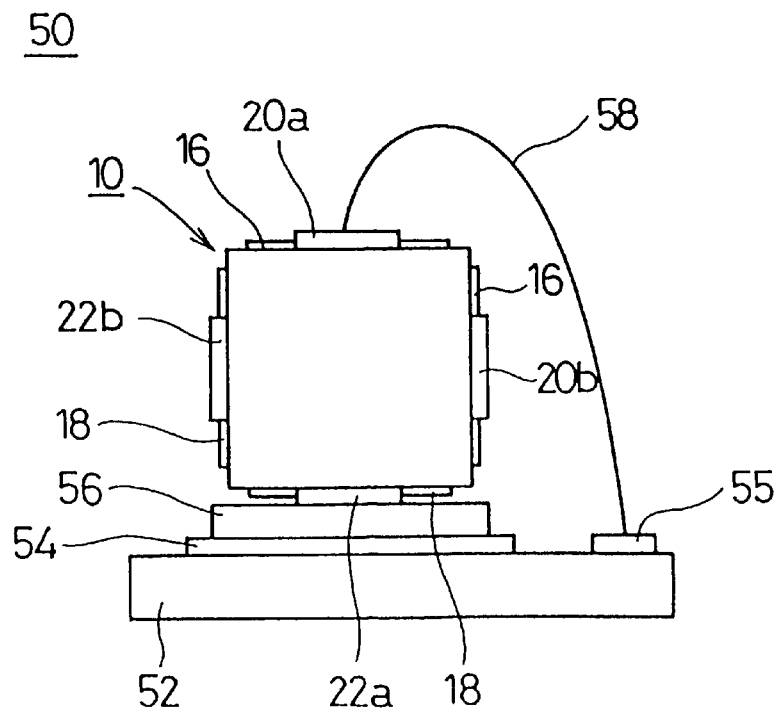
FIG. 5 is a side view of the piezoelectric resonator shown in FIG. 1, showing wiring in the resonator.

FIG. 4 is a schematic front view of an example of an electronic component 50 which uses the piezoelectric resonator shown in FIG. 1, and FIG. 5 is a side view of the electronic component 50, showing wiring in the electronic component 50.

The electronic component 50 shown in FIGS. 4 and 5 is used as a discriminator. The discriminator 50 includes an insulating substrate 52. Pattern electrodes 54 and 55 are disposed on the insulating substrate 52. The piezoelectric resonator 10 is bonded to the pattern electrode 54 preferably by an electroconductive adhesive 56 provided as a conductor material. In this example, the electroconductive adhesive 56 is fixed on the first external electrode 22a of the piezoelectric resonator 10 preferably at the center thereof. The electroconductive adhesive 56 electrically connects the second external electrode 22b and the pattern electrode 54 and functions as a supporting member for fixing the piezoelectric resonator 10. In this example, therefore, the electroconductive adhesive 56 preferably has a substantially rectangular block shape.

In this discriminator 50, the first external electrode 20a and the pattern electrode 55 are preferably connected by a wire 58. The piezoelectric resonator 10, the wire 58 and other components on the substrate are covered with, for example, a metallic cap (not shown), thus completing the discriminator 50.

Since this discriminator 50 has the first external electrode 20a and the second external electrode 20b connected in common to the internal electrodes 14 and also has the other first external electrode 22a and the other second external electrode 22b connected in common to the internal electrodes 14, the piezoelectric resonator 10 may be rotated by 90° about its longitudinal axis from the position shown in FIG. 5 to connect the second external electrode 20b to the pattern electrode 54 and to connect the other second external electrode 22b to the pattern electrode 55. The piezoelectric resonator 10 may be further rotated by 90° to connect the first external electrode 20a to the pattern electrode 54 and to connect the other first external electrode 22a to the pattern electrode 55. That is, this piezoelectric resonator 10 is free from a directional restriction at the time of mounting. Accordingly, the need for a step for predetermined directional positioning of the piezoelectric resonator 10 in the process of manufacturing and assembling the discriminator 50 can be eliminated, thereby simplifying manufacturing operations and reducing the manufacturing cost.

A ceramic oscillator may also be made by using the same construction as that shown in FIGS. 4 and 5.

FIG. 6 is a perspective view of another piezoelectric resonator 10 according to the preferred embodiments of the present invention. FIG. 7A is a cross-sectional view taken along the line VIIA—VIIA of FIG. 6, and FIG. 7B is a cross-sectional view taken along the line VIIB—VIIB of FIG. 6. FIG. 8 is a diagram showing connections between external electrodes in a laminated body 12 of the piezoelectric resonator 10 shown in FIG. 6.

The piezoelectric resonator 10 shown in FIG. 6 differs from the piezoelectric resonator 10 shown in FIG. 1 in the arrangement of insulating films 16 and 18.

That is, in the piezoelectric resonator 10 shown in FIG. 6, strips of insulating film 16 are disposed on two side surfaces of the laminated body 12 opposite to each other in the direction of the thickness of the laminated body 12. These strips of insulating film 16 cover exposed edges of internal electrodes 14.

On the other hand, strips of insulating film 18 are disposed on the other two side surfaces of the laminated body 12 opposite to each other in the direction of the thickness of the laminated body 12. These strips of insulating film 18 cover exposed edges of internal electrodes 14' not covered with insulating film 16 on the two side surfaces described in the previous paragraph.

On one of the two side surfaces on which insulating film 16 is formed, a first external electrode 20a is disposed to extend from one end to the other end of the laminated body 12 in the longitudinal direction. On the other of the two side surfaces, a second external electrode 20b is disposed to extend from one end to the other end of the laminated body 12 in the longitudinal direction. The first and second external electrodes 20a and 20b are connected to the internal electrodes 14' not covered with insulating film 16.

On the other hand, on one of the two side surfaces on which insulating film 18 is disposed, another first external electrode 22a is arranged to extend from one end to the other end of the laminated body 12 in the longitudinal direction. On the other of the two side surfaces, another second external electrode 22b is arranged to extend from one end to the other end of the laminated body 12 in the longitudinal direction. These first and second external electrodes 22a and 22b are connected to the internal electrodes 14 not covered with insulating film 18.

The connections of the first external electrodes 20a and 22a and the second external electrodes 20b and 22b thereby made in the laminated body 12 are as shown in FIG. 8. That is, the first and second external electrodes 20a and 20b are connected to each other through the internal electrodes 14' in the laminated body 12 while the other first and second external electrodes 22a and 22b are connected to each other through the other internal electrodes 14 in the laminated body 12.

The piezoelectric resonator 10 shown in FIG. 6 operates in the same manner and provides the advantages that the resonator shown in FIG. 1 does.

Figure 9:
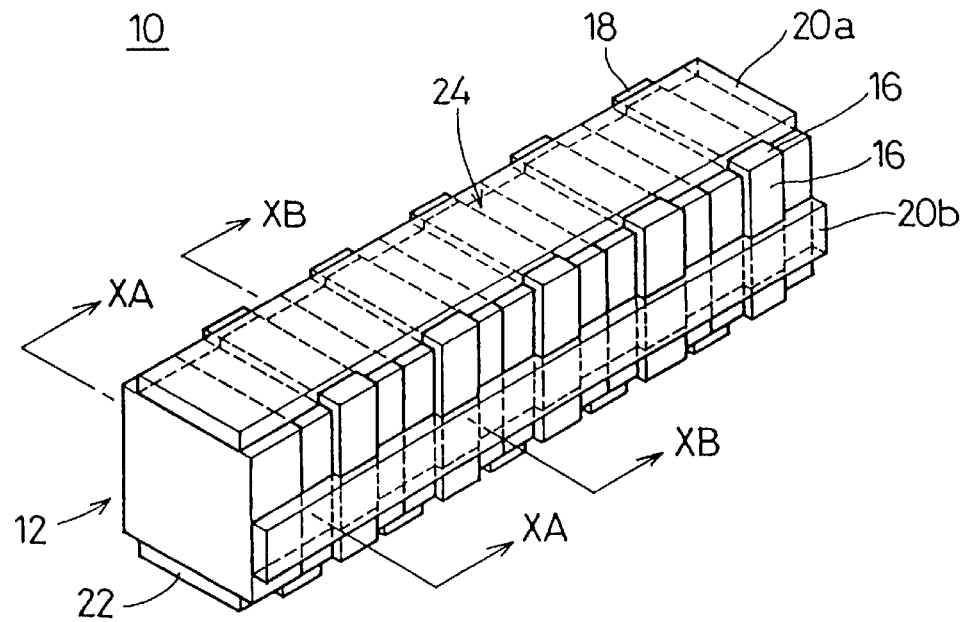
FIG. 9 is a perspective view of still another example of the piezoelectric resonator of the preferred embodiments of the present invention.
Figure 10A:
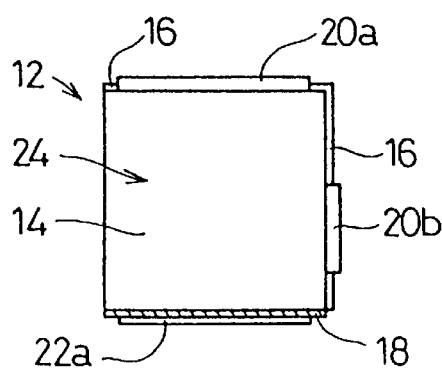
FIG. 10A is a cross-sectional view taken along the line XA—XA of FIG. 9.
Figure 10B:
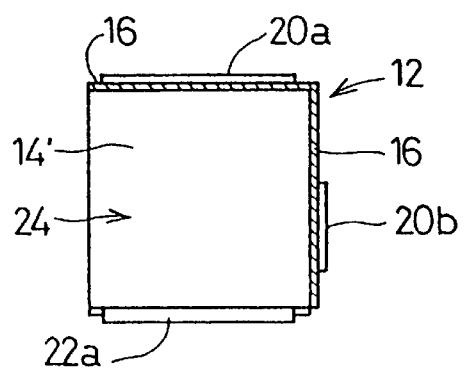
FIG. 10B is a cross-sectional view taken along the line XB—XB of FIG. 9.
Figure 11:
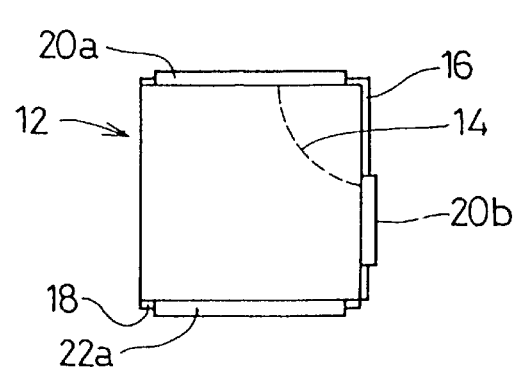
FIG. 11 is a diagram of connections between external electrodes in the laminated body of the piezoelectric resonator shown in FIG. 9.

FIG. 9 is a perspective view of still another piezoelectric resonator 10 according to the preferred embodiments of the present invention. FIG. 10A is a cross-sectional view taken along the line XA—XA of FIG. 9, and FIG. 10B is a cross-sectional view taken along the line XB—XB of FIG. 9. FIG. 11 is a diagram showing connections between external electrodes in a laminated body 12 of the piezoelectric resonator 10 shown in FIG. 9.

The piezoelectric resonator 10 shown in FIG. 9 differs from the piezoelectric resonator 10 shown in FIG. 1 in that on the side surface opposite from the side surface on which a second external electrode 20b is disposed, another second external electrode 22b is not formed, and in that, on this side surface, insulating film 18 is not formed. In other respects, this piezoelectric resonator is essentially the same as the piezoelectric resonator shown in FIG. 1. In this piezoelectric resonator 10, however, each of strips of insulating films 16 and 18 has a length which is substantially equal to the width of the laminated body 12.

The piezoelectric resonator 10 shown in FIG. 9 operates in the same manner and provides the same advantages as the resonator shown in FIG. 1 does.

Figure 12:
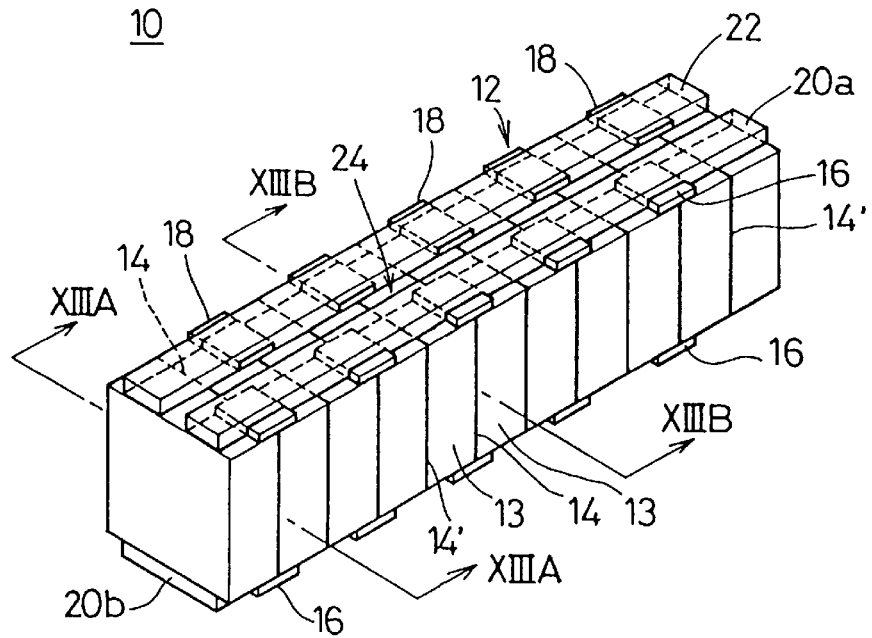
FIG. 12 is a perspective view of a further example of the piezoelectric resonator of the preferred embodiments of the present invention.
Figure 13A:
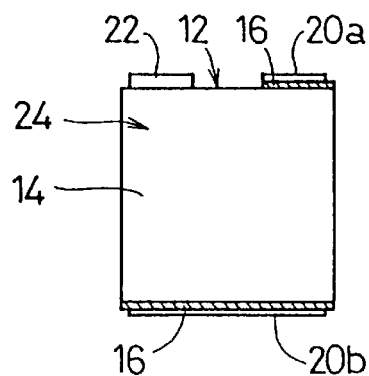
FIG. 13A is a cross-sectional view taken along the line XIIIA—XIIIA of FIG. 12.
Figure 13B:
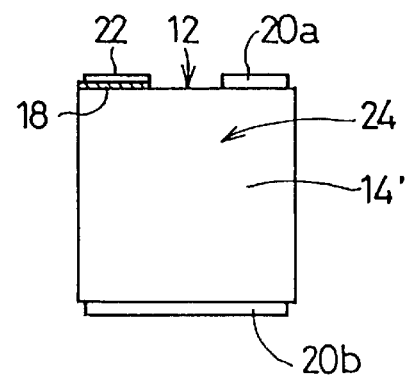
FIG. 13B is a cross-sectional view taken along the line XIIIB—XIIIB of FIG. 12.
Figure 14:
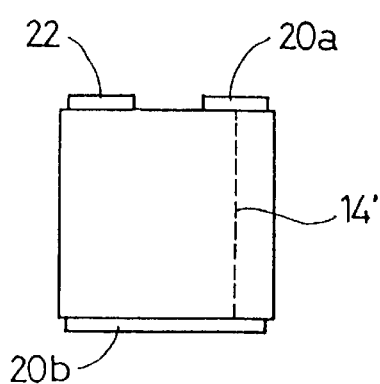
FIG. 14 is a diagram of connections between external electrodes in the laminated body of the piezoelectric resonator shown in FIG. 12.

FIG. 12 is a perspective view of a further piezoelectric resonator 10 according to the preferred embodiments of the present invention. FIG. 13A is a cross-sectional view taken along the line XIIIA—XIIIA of FIG. 12, and FIG. 13B is a cross-sectional view taken along the line XIIIB—XIIIB of FIG. 12. FIG. 14 is a diagram showing connections between external electrodes in a laminated body 12 of the piezoelectric resonator 10 shown in FIG. 12.

The piezoelectric resonator 10 shown in FIG. 12 differs from the piezoelectric resonator shown in FIG. 1 in the arrangement of insulating films 16 and 18 and in the formation of external electrodes.

That is, in the piezoelectric resonator 10 shown in FIG. 12, pieces of insulating film 16 for covering internal electrodes 14 are disposed adjacent to one of the longer sides of one side surface of the laminated body 12 while pieces of insulating film 18 for covering internal electrodes 14' are disposed adjacent to the other longer side of this side surface. Over the pieces of insulating film 16, a first external electrode 20a is arranged to extend from one end to the other end of the laminated body 12 in the longitudinal direction. Over the pieces of insulating film 18, another first external electrode 22 is arranged to extend from one end to the other end of the laminated body 12 in the longitudinal direction. On the side surface opposite to this side surface of the laminated body 12 in the direction of the thickness, pieces of insulating film 16 for covering the internal electrodes 14 are also disposed. Over these pieces of insulating film 16, a second external electrode 20b is arranged to extend from one end to the other end of the laminated body 12 in the longitudinal direction.

The first and second external electrodes 20a and 20b are connected to the internal electrodes 14' not covered with insulating film 16 while the other first external electrode 22 is connected to the internal electrode 14 not covered with insulating film 18.

The piezoelectric resonator 10 shown in FIG. 12 operates in the same manner and achieves the same advantages as the resonator shown in FIG. 1. This piezoelectric resonator 10 is easier to mount in a surface mount manner because the first external electrode 20a connected to the internal electrodes 14' and the first external electrode 22 connected to the internal electrodes 14 are disposed on one common side surface. Moreover, to one piezoelectric resonator 10 of this type, another piezoelectric resonator 10 can be connected by being superposed thereon because the second external electrode 20b connected to the first external electrode 20a through the internal electrodes 14' is disposed on the side surface opposite to the direction of the thickness of the laminated body 12 from the side surface on which the external electrode 20a is provided.

In the above-described piezoelectric resonators 10 shown in FIGS. 1 to 12, insulating film 16 or 18 is used for insulation of each of the external electrodes 20a, 20b, 22, 22a and 22b from the internal electrode 14 or 14'. However, other means for this insulation are possible according to the preferred embodiments of the present invention. For example, each piezoelectric resonator 10 may be constructed in the same manner as described in Japanese Patent Application 8-110475 which was invented by the applicant of the present invention. That is, each of the internal electrodes 14 and 14' may be insulated from the external electrode 20a, 20b, 22, 22a or 22b on one side surface of the laminated body 12 in such a manner that the internal electrodes 14 and 14' alternately have exposed and unexposed edges by reducing the area of their major surfaces relative to the sectional area of the laminated body 12, each of the internal electrodes 14 and 14' being insulated from the external electrode 20a, 20b, 22, 22a or 22b at the unexposed edges.

Figure 15:
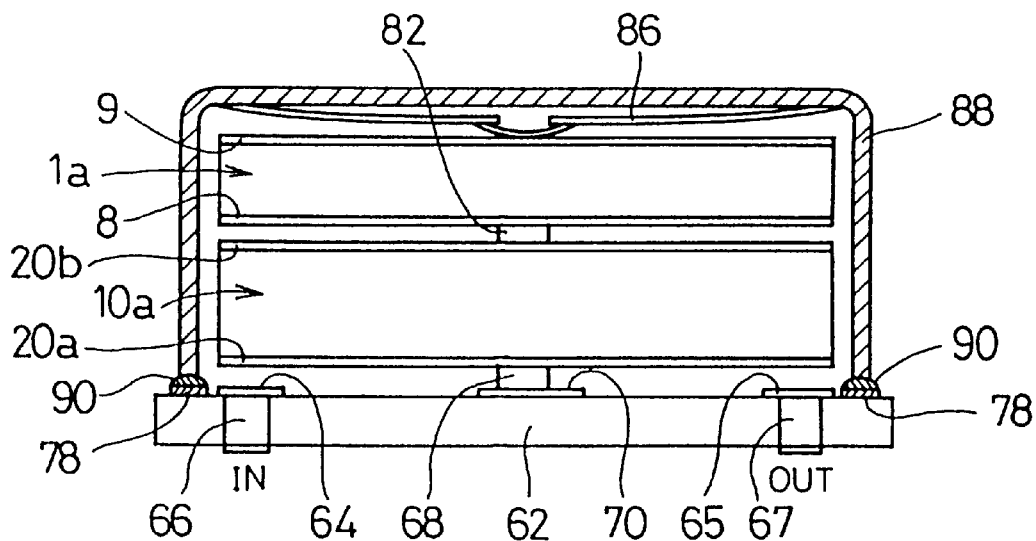
FIG. 15 is a partially-cutaway longitudinal sectional view of an electronic component using the piezoelectric resonator shown in FIG. 12.
Figure 16:
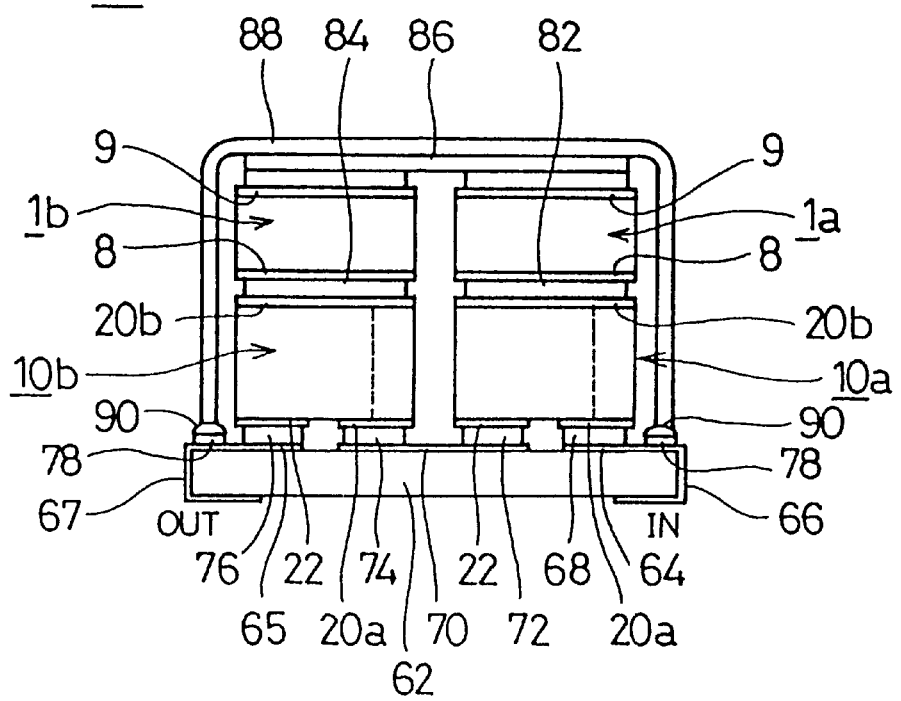
FIG. 16 is a transverse sectional view of the electronic component shown in FIG. 15, showing electrical connections in the electronic component.
Figure 17:
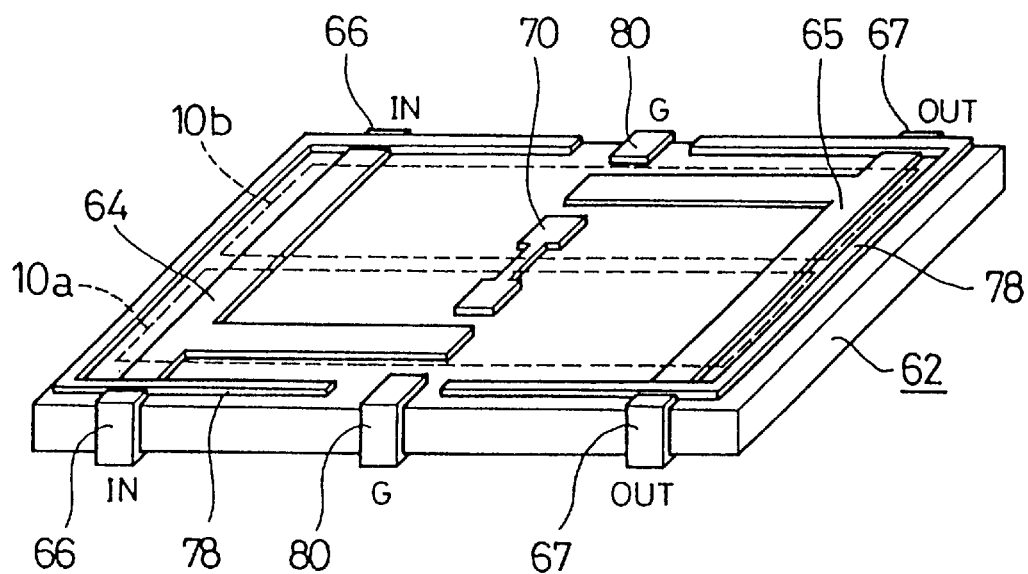
FIG. 17 is a perspective view of a substrate used in the electronic component shown in FIGS. 15 and 16.

FIG. 15 is a partially-cutaway longitudinal sectional view of an electronic component 60 using the piezoelectric resonator shown in FIG. 12. FIG. 16 is a transverse sectional view showing electrical connections in the electronic component 60. FIG. 17 is a perspective view of a substrate 62 used in the electronic component 60 shown in FIGS. 15 and 16.

Figure 20:
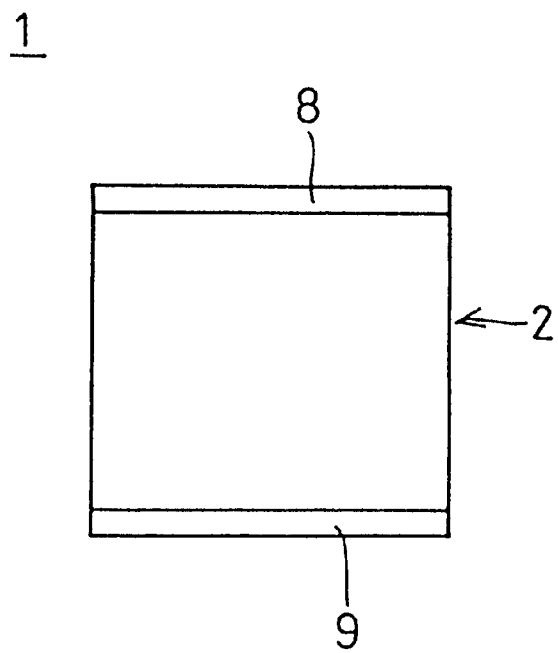
FIG. 20 is a diagram of the disposition of external electrodes on the piezoelectric resonator shown in FIG. 19.
Figure 21:
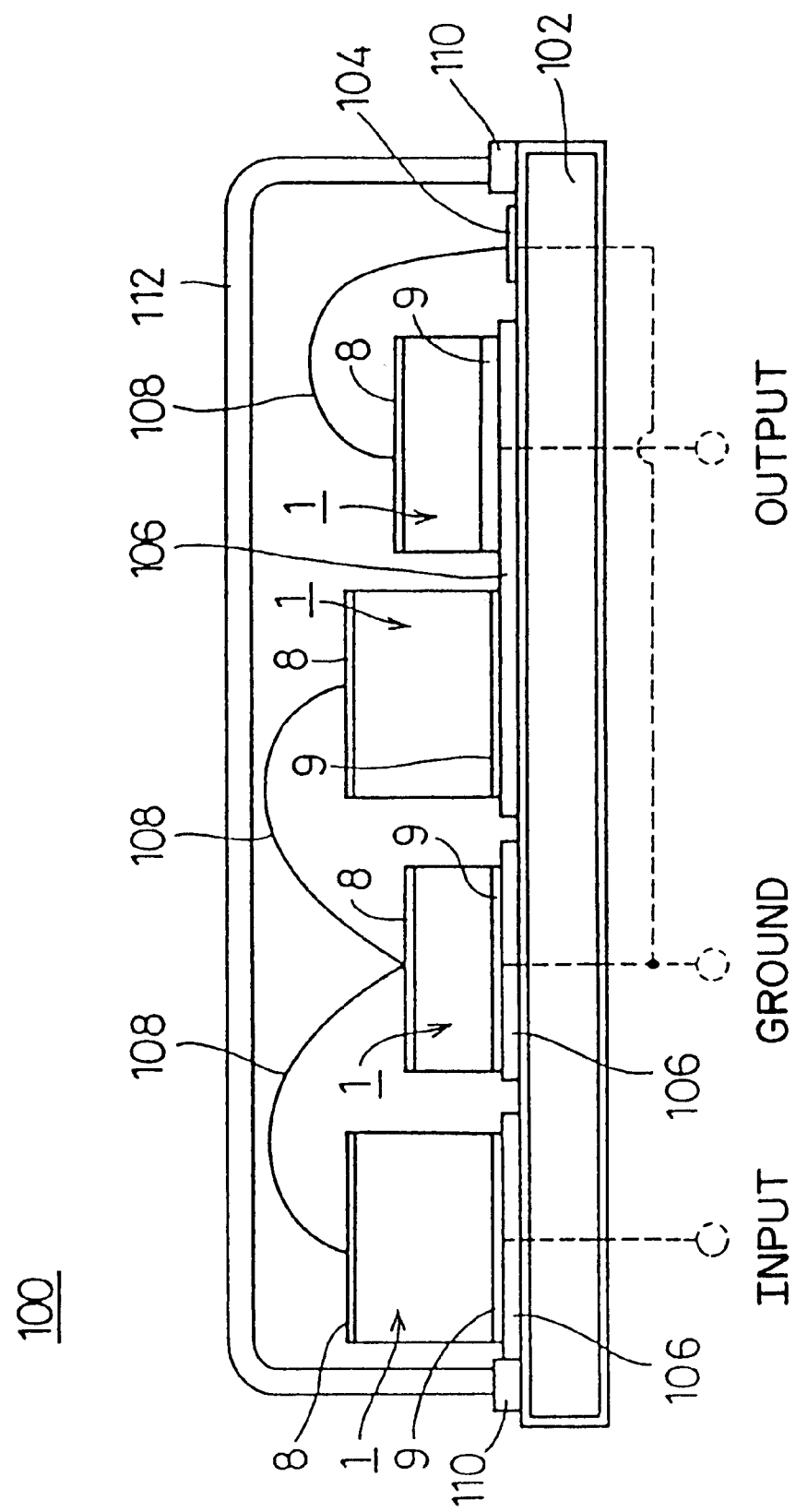
FIG. 21 is a diagram of a ladder type filter constructed by combining a plurality of the laminated piezoelectric resonators shown in FIG. 19.

The electronic component 60 shown in FIGS. 15 and 16 is constructed to define a ladder type filter. The ladder type filter 60 includes piezoelectric resonators 10a and 10b of the same construction as the piezoelectric resonator 10 shown in FIG. 12, and laminated piezoelectric resonators 1a and 1b of the same construction as the laminated piezoelectric resonator 1 shown in FIGS. 19 and 20.

This ladder type filter 60 also includes the insulating substrate 62 which has, for example, the shape of a substantially rectangular plate. Pattern electrodes on the insulating substrate 62 will next be described with reference to FIG. 17. The broken lines in FIG. 17 indicate the positions of the two piezoelectric resonators 10a and 10b disposed on the insulating substrate 62.

A first pattern electrode 64 is arranged on one major surface of the insulating substrate 62 (obverse surface as viewed in FIG. 17) at one end in the longitudinal direction of the insulating substrate 62 so as to extend from one end to the other end in the widthwise direction of the insulating substrate 62. The two ends of the first pattern electrode 64 are connected to input/output electrodes 66 on two side surfaces of the insulating substrate 62. Each input/output electrode 66 is arranged into an angle shape so as to extend from the side surface to a position on the reverse surface of the insulating substrate 62. The first pattern electrode 64 has an extension which extends from a position in the vicinity of one of the longer sides of the obverse surface of the insulating substrate 62 to a position at the center of the insulating substrate 62 in the longitudinal direction of the insulating substrate 62. The first pattern electrode 64 is connected at the end of this extension to the first external electrode 20a of the piezoelectric resonator 10a. This connection is preferably made by using an electroconductive adhesive 68 acting as a conductor material, as shown in FIGS. 15 and 16.

A second pattern electrode 70 is disposed at the center of the insulating substrate 62 so as to extend in the widthwise direction of the insulating substrate 62. The second pattern electrode 70 connects, through its two end portions, the other first external electrode 22 of the piezoelectric resonator 10a and the first external electrode 20a of the piezoelectric resonator 10b. These connections are made by using electroconductive adhesives 72 and 74, as shown in FIG. 16.

A second pattern electrode 65 is disposed at the other end of the insulating substrate 62 in the longitudinal direction so as to extend from one end to the other end in the widthwise direction of the insulating substrate 62, as shown in FIG. 17. The two ends of the second pattern electrode 65 are connected to input/output electrodes 67 on the two side surfaces of the insulating substrate 62. Each input/output electrode 67 is arranged into an angle shape such as to extend from the side surface to a position on the reverse surface of the insulating substrate 62. The second pattern electrode 65 has an extension which extends from a position in the vicinity of the other longer side of the obverse surface of the insulating substrate 62 to a position at the center of the insulating substrate 62 in the longitudinal direction of the insulating substrate 62. The second pattern electrode 65 is connected at the end of this extension to the other external electrode 22 of the piezoelectric resonator 10b. This connection is made by using an electroconductive adhesive 76 as a conductor material, as shown in FIG. 16.

Insulators 78 are preferably disposed on a peripheral end portion of the insulating substrate 62. The insulators 78 are provided for insulation between a metallic cap 88 described below and each of the first and second pattern electrodes 64 and 65.

The insulators 78 are spaced apart from each other at two positions on the opposite sides of the center of the insulating substrate 62 in the widthwise direction. In the spacing areas between the insulators 78, ground electrodes 80 to be connected to the metallic cap 88 are formed. Each ground electrode 80 extends to a position on the reverse surface of the insulating substrate 62 via the side surface of the insulating substrate 62.

The above-described electroconductive adhesives 68, 72, 74 and 76 electrically connect the electrodes and also serve as members for supporting the piezoelectric resonators 10a and 10b at the center in the longitudinal direction. Accordingly, each of the electroconductive adhesives 68, 72, 74 and 76 preferably has a substantially rectangular block shape, for example.

The laminated piezoelectric resonators 1a and 1b provided on the insulating substrate 62 and the placement and connection of the metallic cap 88 will next be described.

The laminated piezoelectric resonator 1a is superposed on the piezoelectric resonator 10a. The external electrode 8 of the laminated piezoelectric resonator 1a and the second external electrode 20b of the piezoelectric resonator 10a are connected to each other by an electroconductive adhesive 82 provided as a conductor material.

The laminated piezoelectric resonator 1b is superposed on the piezoelectric resonator 10b. The external electrode 8 of the laminated piezoelectric resonator 1b and the second external electrode 20b of the piezoelectric resonator 10b are connected to each other by an electroconductive adhesive 84 provided as a conductor material.

These electroconductive adhesives 82 and 84 electrically connect the electrodes and also serve as members for supporting the laminated piezoelectric resonators 1a and 1b at the center in the longitudinal direction. Accordingly, each of the electroconductive adhesives 82 and 84 preferably has substantially rectangular block shape, for example.

A spring terminal 86 formed of a plate-spring-like member is provided on the laminated piezoelectric resonators 1a and 1b for the purpose of urging central portions of the laminated bodies of the laminated piezoelectric resonators 1a and 1b toward the insulating substrate 62 and electrically connecting the external electrodes 9 and the metallic cap 88.

Figure 18:
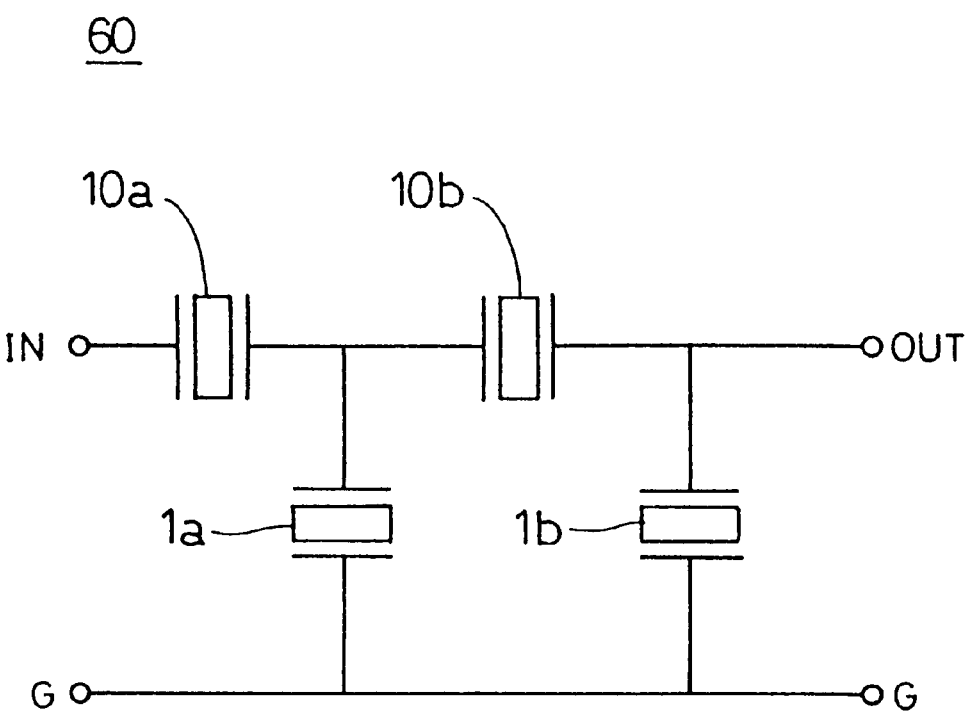
FIG. 18 is a circuit diagram of the electronic component shown in FIGS. 15 and 16.

The metallic cap 88 having an electroconductive property is attached as an overall cover above the spring terminal 86. The spring terminal 86 is supported by the internal ceiling surface of the metallic cap 88. An edge portion of the metallic cap 88 is bonded to the insulators 78 on the insulating substrate 62 by an electroconductive adhesive 90. The metallic cap 88 is thereby insulated from the first and second pattern electrodes 64 and 65. On the other hand, where the insulators 78 are spaced apart from each other on the insulating substrate 62, the metallic cap 88 is directly bonded and electrically connected to the ground electrodes 80 by electroconductive adhesive 90. Electrical connections are thus made in the ladder type filter 60 to form a circuit such as that shown in FIG. 18.

In this ladder type filter 60, the piezoelectric resonators 10a and 10b are constructed as described above to enable a plurality of laminated piezoelectric resonators 1a and 1b to be superposed on the piezoelectric resonators 10a and 10b. Therefore, the area of the insulating substrate 62 can be reduced and the packaging density can be increased. As a result, the entire electrical component has a substantially reduced size. In this ladder type filter 60, since the piezoelectric resonators 10a and 10b are constructed as described above, there is no need for wire bonding, so that the connections between the elements can be simplified and the total manufacturing cost can be reduced.

In the above-described ladder type filter 60, the laminated type piezoelectric resonator 1 is superposed on the piezoelectric resonator 10 of the preferred embodiments of the present invention. However, any of the piezoelectric resonators 10 shown in FIGS. 1 to 12 may alternatively be superposed instead of the laminated type piezoelectric resonator 1 to constitute an electronic component.

The discriminator and the ladder type filter, which are examples of the electronic components using the piezoelectric resonator of the present invention, have been described as preferred embodiments of the present invention. However, the present invention may also be used to form electronic components other than those described above.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
    a piezoelectric base member having a plurality of internal electrodes disposed therein;
    means for driving the piezoelectric base member so as to vibrate the piezoelectric base member in a longitudinal vibration mode along a longitudinal axis of the piezoelectric base member and such that a vibration node of the piezoelectric base member is defined approximately at a center portion of the base member; and
    at least one first external electrode disposed on a side surface of the piezoelectric base member; and
    a second external electrode connected to said at least one first external electrode through said plurality of internal electrodes disposed in the piezoelectric base member, said second external electrode being disposed on a side surface of the piezoelectric base member different from the side surface on which said first external electrode is disposed.

2. A piezoelectric resonator according to claim 1, wherein said side surface of said piezoelectric base member on which said at least one first external electrode is disposed and said side surface on which said second external electrode is disposed comprise adjacent side surfaces of said piezoelectric base member.

3. A piezoelectric resonator according to claim 1, further comprising a third external electrode disposed on a side surface of said piezoelectric base member on which said at least one first external electrode and said second external electrode are not disposed.

4. A piezoelectric resonator according to claim 1, further comprising a third external electrode disposed on a side surface of said piezoelectric base member on which one of said at least one first external electrode and said second external electrode is disposed.

5. A piezoelectric resonator according to claim 1, further comprising a third external electrode disposed on a side surface of said piezoelectric base member on which said at least one first external electrode and said second external electrode are not disposed and a fourth external electrode disposed on a side surface of said piezoelectric base member on which said at least one first external electrode, said second external electrode and said third external electrode are not disposed, the third and fourth external electrodes being electrically connected to each other via said plurality of internal electrodes.

6. A piezoelectric resonator according to claim 1, wherein said piezoelectric base member comprises an integral laminated body including said plurality of internal electrodes and a plurality of separate piezoelectric layers, said plurality of internal electrodes and said plurality of separate piezoelectric layers being laminated to form said integral laminated body.

7. A piezoelectric resonator according to claim 6, wherein said plurality of piezoelectric layers are polarized along a longitudinal direction of said piezoelectric base member.

8. A piezoelectric resonator according to claim 6, wherein adjacent pairs of said plurality of piezoelectric layers located on opposite sides of each of said plurality of internal electrodes are polarized in opposite directions.

9. A piezoelectric resonator according to claim 1, further comprising a first insulating film and a second insulating film, said first insulating film being disposed on a surface of said piezoelectric base member so as to cover exposed edges of a first group of said plurality of internal electrodes and said second insulating film being disposed on a surface of said piezoelectric base member so as to cover exposed edges of a second group of said plurality of internal electrodes which are not covered by said first insulating film.

10. A piezoelectric resonator comprising:
 a laminated body having a length in a longitudinal direction;
 a vibrating section constituting at least a first part of said laminated body, said vibrating section including a plurality of piezoelectric layers polarized along the longitudinal direction of said laminated body and a plurality of internal electrodes arranged in said laminated body so that major surfaces of said internal electrodes are substantially perpendicular to said longitudinal direction of said laminated body, said piezoelectric layers and said internal electrodes being alternately laminated;
 means for driving said vibrating section such that said vibrating section generates vibration in a longitudinal fundamental mode in said laminated body in the longitudinal direction of the laminated body and such that a vibration node of the laminated body is defined approximately at a center portion of the laminated body;
 at least one first external electrode disposed on a side surface of said laminated body and connected to one of said internal electrodes located on opposite sides of each of said piezoelectric layers constituting said vibrating section; and
 a second external electrode disposed on a side surface of said laminated body different from the side surface on which said at least one first external electrode is disposed, said second external electrode being connected to said at least one first external electrode through the internal electrode connected to said at least one first external electrode.

11. A piezoelectric resonator according to claim 10, wherein said side surface of said laminated body on which said at least one first external electrode is disposed and said side surface on which said second external electrode is disposed comprise adjacent side surfaces of said laminated body.

12. A piezoelectric resonator according to claim 10, further comprising a third external electrode disposed on a side surface of said laminated body on which said at least one first external electrode and said second external electrode are not disposed.

13. A piezoelectric resonator according to claim 10, further comprising a third external electrode disposed on a side surface of said laminated body on which one of said at least one first external electrode and said second external electrode is disposed.

14. A piezoelectric resonator according to claim 10, further comprising a third external electrode disposed on a side surface of said laminated body on which said at least one first external electrode and said second external electrode are not disposed and a fourth external electrode disposed on a side surface of said laminated body on which said at least one first external electrode, said second external electrode and said third external electrode are not disposed.

15. An electronic component comprising:
 a first piezoelectric resonator including at least one pair of external electrodes;
 a second piezoelectric resonator including a laminated body and having a plurality of internal electrodes;
 means for driving said second resonator to vibrate said second piezoelectric resonator in a longitudinal vibration mode along a longitudinal axis of the laminated body such that a vibration node of the laminated body is defined approximately at a center portion of the laminated body, the second piezoelectric resonator including at least one pair of external electrodes which are connected to each other via said plurality of internal electrodes and are disposed on at least two different side surfaces of said laminated body; wherein
 said first and second piezoelectric resonators are superposed on one another, and
 one of said at least one pair of external electrodes of said first piezoelectric resonator and one of said at least one pair of external electrodes of said second piezoelectric resonator are connected to each other.

16. A piezoelectric resonator according to claim 15, wherein said at least one pair of external electrodes of said second piezoelectric resonator are disposed on adjacent side surfaces of said second piezoelectric resonator.

17. A piezoelectric resonator according to claim 16, wherein said second piezoelectric resonator further comprises a third external electrode disposed on a side surface of said laminated body on which said at least one pair of external electrodes are not disposed.

18. A piezoelectric resonator according to claim 16, wherein said second piezoelectric resonator further comprises a third external electrode disposed on a side surface of said laminated body on which one of said at least one pair of external electrodes is disposed.

19. A piezoelectric resonator according to claim 16, wherein said second piezoelectric resonator further comprises a third external electrode disposed on a side surface of said laminated body on which said at least one pair of external electrodes are not disposed and a fourth external electrode disposed on a side surface of said laminated body on which said at least one pair of external electrodes are not disposed.

20. An electronic component comprising:
- a substrate having a pattern electrode disposed on a surface thereof;
- a plurality of piezoelectric resonators each including at least one pair of external electrodes, at least one of said plurality of piezoelectric resonators including a laminated body and having a plurality of internal electrodes;
- means for driving said at least one of said piezoelectric resonators to vibrate said at least one of said piezoelectric resonators in a longitudinal vibration mode along a longitudinal axis of the laminated body such that a vibration node of the laminated body is defined approximately at a center portion of the laminated body, said at least one pair of external electrodes of said at least one of said plurality of electrodes are connected to each other via said plurality of internal electrodes and are disposed on at least two different side surfaces of said laminated body; wherein said plurality of piezoelectric resonators are mounted on said substrate and are superposed on one another;

one of said at least one pair of electrodes of a first of said plurality of piezoelectric resonators is connected to said pattern electrode disposed on said substrate; and the other of said at least one pair of electrodes of a first of said plurality of piezoelectric resonators and one of said at least one pair of electrodes of a second of said plurality of piezoelectric resonators are connected to each other.

* * * * *